(12) United States Patent
Cha et al.

(10) Patent No.: US 8,035,039 B2
(45) Date of Patent: Oct. 11, 2011

(54) ELECTROMAGNETIC SHIELDING SHEET, PLASMA DISPLAY APPARATUS USING THE SAME, AND RELATED TECHNOLOGY

(75) Inventors: Hong Rae Cha, Seoul (KR); Gi Jin Kwon, Seoul (KR); Eun Seong Seo, Seoul (KR); Jin Woo Park, Seoul (KR); Woon Seo Shin, Seoul (KR); Joon Kwon Moon, Seoul (KR); Ji Hoon Sohn, Seoul (KR)

(73) Assignee: LG Electronics Inc., Seoul (KR)

( * ) Notice: Subject to any disclaimer, the term of this patent is extended or adjusted under 35 U.S.C. 154(b) by 305 days.

(21) Appl. No.: 12/240,831

(22) Filed: Sep. 29, 2008

(65) Prior Publication Data

US 2009/0145654 A1    Jun. 11, 2009

(30) Foreign Application Priority Data

Dec. 5, 2007 (KR) .................. 10-2007-0125642
Apr. 28, 2008 (KR) .................. 10-2008-0039431

(51) Int. Cl.
*H05K 9/00* (2006.01)
(52) U.S. Cl. .................. 174/389; 174/392; 313/313
(58) Field of Classification Search .................. 174/389, 174/392; 361/816, 818; 313/313
See application file for complete search history.

(56) References Cited

U.S. PATENT DOCUMENTS

| 6,262,364 B1 * | 7/2001 | Yoshikawa et al. ........... 174/389 |
| 6,657,387 B1 * | 12/2003 | Yoo .............................. 313/587 |
| 2004/0239248 A1 * | 12/2004 | Chang et al. .................. 313/582 |
| 2006/0194020 A1 * | 8/2006 | Naito et al. .................... 428/138 |
| 2006/0250064 A1 | 11/2006 | Park et al. |

FOREIGN PATENT DOCUMENTS

| EP | 1755139 A1 | 2/2007 |
| EP | 1770750 A2 | 4/2007 |
| EP | 1835522 A2 | 9/2007 |

(Continued)

OTHER PUBLICATIONS

European Search Report dated Apr. 29, 2010 for Application No. 08165309.9, 9 pages.

(Continued)

*Primary Examiner* — Hung Ngo
(74) *Attorney, Agent, or Firm* — Fish & Richardson P.C.

(57) ABSTRACT

There are provided an electromagnetic shielding sheet and a plasma display apparatus. The electromagnetic shielding sheet includes a base sheet; a first layer on a first surface of the base sheet, the first layer including first and second patterns crossing each other; and a second layer on a second surface of the base sheet, the second layer including a third pattern. The first and second patterns include a conductive material, the third pattern includes a light absorbing material, and at least one of the first and second patterns is grounded. Accordingly, conductive patterns for shielding electromagnetic waves and blocking external light are formed on a first surface of a base sheet, and patterns for blocking external light are formed on a second surface of the base sheet, so that the functions of shielding electromagnetic waves and blocking external light can be simultaneously performed using one sheet, and therefore, the ambient contrast ratio of a display image can be enhanced without increasing manufacturing costs. Further, patterns for shielding electromagnetic waves are directly formed a glass member of a filter or an upper substrate of the panel, so that processes of forming an electromagnetic shielding sheet can be easily performed.

19 Claims, 12 Drawing Sheets

FOREIGN PATENT DOCUMENTS

| | | |
|---|---|---|
| KR | 10-2005110773 A | 11/2005 |
| KR | 10-2007028144 A | 3/2007 |
| KR | 2007037329 A | 4/2007 |
| KR | 102007080351 A | 8/2007 |
| KR | 100761298 B1 | 9/2007 |
| KR | 780283 B1 | 11/2007 |
| WO | WO2008010624 A1 | 1/2008 |

OTHER PUBLICATIONS

Korean Office Action for Korean Patent Application No. 10-2008-0039431 dated Sep. 29, 2010 (13 pages).

Korean Notice of Allowance dated May 31, 2011 for Application No. 10-2008-0039431, with English Translation, 5 pages.

\* cited by examiner

ELECTROMAGNETIC SHIELDING SHEET, PLASMA DISPLAY APPARATUS USING THE SAME, AND RELATED TECHNOLOGY

BACKGROUND

1. Field

An electromagnetic shielding sheet and a plasma display apparatus use an electromagnetic shielding sheet. In one implementation, a plasma display apparatus filter includes an electromagnetic shielding sheet and is disposed on a front side of a plasma display panel.

2. Discussion of Related Art

In general, a plasma display panel is an apparatus that displays images including characters or graphics by applying a predetermined voltage to electrodes installed in a discharge space to cause discharge, and allowing plasma generated in a gas discharge to excite phosphors, and has the advantages such as large-scale, lightweight and surface-thinning, vertically and laterally wide view angle, full color and high brightness.

In such a plasma display panel, when a black image is implemented, external light is reflected from a front side of the panel due to a whitish fluorescent material exposed on a lower substrate of the panel. Therefore, a black image is recognized as a bright dark color, and thus contrast may be lowered.

SUMMARY

In one aspect an electromagnetic shielding sheet is provided which can improve the ambient contrast ratio of a display panel by shielding electromagnetic interference and effectively shielding external light incident onto the panel, and a plasma display apparatus using the same.

According to one aspect, there is provided an electromagnetic shielding sheet, including a base sheet, a first layer, and a second layer. The first layer includes first and second patterns crossing each other, the first and second patterns being positioned on a first surface of the base sheet. The second layer includes a third pattern, the third pattern being positioned on a second surface of the base sheet. The first and second patterns include conductive material, the third pattern includes a light absorbing material, and at least one of the first and second patterns is electrically connected to ground.

Implementations may include one or more of the following exemplary features. For instance, the first and second patterns may be made of a darkened metal. The third pattern may overlap at least one of the first and second patterns. The second layer may include a fourth pattern having a width smaller than the third pattern, with the aperture ratio of each of the first and second layers being greater than about 50% and less than about 95%. The base sheet may include a shape with a shorter side and a longer side, with a width of at least one of the first and second patterns being different from a width of the third pattern, the second pattern being oriented in a direction parallel with the shorter side of the base sheet, and the width of the second patter being smaller than that of the third pattern. Alternatively, the second pattern may be oriented in a direction parallel with the shorter side of the base sheet; and the width of the second pattern may be smaller than that of the first pattern, with the width of at least one of the first and third patterns being greater than about 5 µm and less than about 100 µm. In yet another alternative, the second pattern is in a direction parallel with the shorter side of the base sheet and is electrically connected to ground. And, in still another alternative, the first pattern includes a plurality of lines in a direction parallel with the longer side of the base sheet, and the second pattern includes a plurality of lines in a direction parallel with the shorter side of the base sheet, with the pitch between adjacent lines in the direction parallel with the longer side of the base sheet being smaller than the pitch between adjacent lines in the direction parallel with the shorter side of the base sheet.

According to another aspect, there is provided a plasma display apparatus including a plasma display panel including an upper substrate and a lower substrate attached to each other, the upper substrate having a plurality of first and second electrodes formed thereon, a lower substrate having a plurality of third electrodes formed thereon; and an electromagnetic shielding sheet disposed on a front side of the panel. In this aspect the electromagnetic shielding sheet includes a base sheet, a first layer on a first surface of the base sheet, the first layer including first and second patterns crossing each other, and a second layer on a second surface of the base sheet, the second layer including a third pattern, wherein the first and second patterns include a conductive material, the third pattern includes a light absorbing material, and at least one of the first and second patterns is electrically connected to ground.

Implementations of this aspect may include one or more of the above or following exemplary features. For instance, the first and second patterns may be positioned between the upper substrate of the panel and the base sheet. At least a portion of both the first and the second patterns may physically contact the upper substrate of the panel. An angle made between the third pattern and the first electrode may be greater than about zero and less than about 50 degrees. A gap between the electromagnetic shielding sheet and the upper substrate of the panel may greater than about 0.02 mm and less than about 0.5 cm.

According to yet another aspect, there is provided a filter disposed on a front side of a plasma display panel, the filter including a first base sheet, and an electromagnetic shielding sheet positioned adjacent to the first base sheet. The electromagnetic shielding sheet includes a second base sheet, a first layer on a first surface of the second base sheet, the first layer including first and second patterns crossing each other, and a second layer on a second surface of the second base sheet, the second layer including a third pattern. The first and second patterns include a conductive material, the third pattern includes a light absorbing material, and at least one of the first and second patterns is electrically connected to ground.

Implementations of this aspect may include one or more of the above and following exemplary features. For instance, the electromagnetic shielding sheet may be laminated on the first base sheet. The first and second patterns may be positioned between the first and second base sheets. The first and second patterns may be physically contact the first base sheet. And, the first base sheet includes glass.

DETAILED DESCRIPTION

Hereinafter, exemplary implementations will be described in detail with reference to the accompanying drawings.

Figure 1:
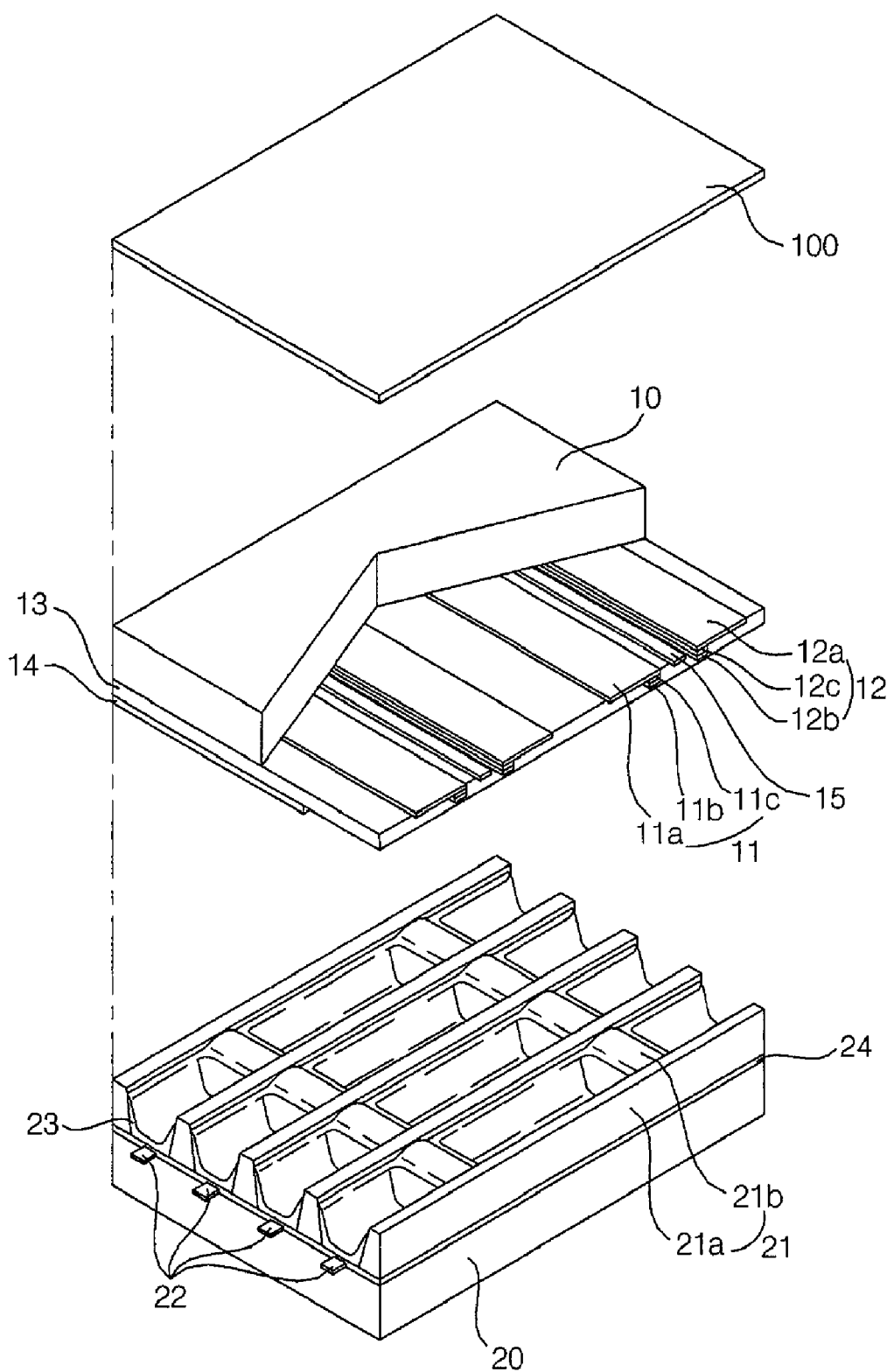
FIG. 1 is a perspective view illustrating an embodiment of the structure of a plasma display panel.

FIG. 1 is a perspective view illustrating an embodiment of the structure of a plasma display panel.

Referring to FIG. 1, the plasma display panel includes a scan electrode 11 and a sustain electrode 12 (that is, a sustain electrode pair), which are formed over an upper substrate 10, and address electrodes 22 formed over a lower substrate 20.

The sustain electrode pair 11 and 12 includes transparent electrodes 11*a* and 12*a* generally formed of indium-tin-oxide (ITO), and bus electrodes 11*b* and 12*b*. The bus electrodes 11*b* and 12*b* may be formed of metal, such as silver (Ag) or chrome (Cr), a stack type of Cr/copper (Cu)/Cr or Cr/aluminum (Al)/Cr. The bus electrodes 11*b* and 12*b* are formed on the transparent electrodes 11*a* and 12*a*, and function to decrease a voltage drop caused by the transparent electrodes 11*a* and 12*a* with a high resistance.

In accordance with an embodiment, the sustain electrode pair 11 and 12 may have a stack structure of the transparent electrodes 11*a* and 12*a* and the bus electrodes 11*b* and 12*b*, but can also include only the bus electrodes 11*b* and 12*b* without the transparent electrodes 11*a* and 12*a*. This structure is advantageous in that it can save the manufacturing cost of the plasma display panel because the transparent electrodes 11*a* and 12*a* are not used. The bus electrodes 11*b* and 12*b* used in the structure may also be formed using a variety of materials, such as a photosensitive material, other than the above-listed materials.

The black matrix 15 is arranged between the transparent electrodes 11*a* and 12*a* and the bus electrodes 11*b* and 12*b* of the scan electrode 11 and the sustain electrode 12. The black matrix 15 has a light-shielding function of absorbing external light generated outside the upper substrate 10 and decreasing reflection of the light and a function of improving the purity and contrast of the upper substrate 10.

The black matrix 15 in accordance with an embodiment is formed over the upper substrate 10. The black matrix 15 may include a first black matrix 11*c* formed at a location where it overlaps a barrier rib 21, and second black matrix 12*c* formed between the transparent electrodes 11*a* and 12*a* and the bus electrodes 11*b* and 12*b*. The first, and second black matrices 11*c* and 12*c*, which are also referred to as black layers or black electrode layers, may be formed at the same time and, therefore, may be connected to each other physically. Alternatively, the first and second black matrices 11*c* and 12*c* may not be formed at the same time and, therefore, may not be connected to each other physically.

In the event that the first and =second black matrices 11*c* and 12*c* are physically connected to each other, the first black matrix 11*c* and the second black matrix 12*c* are formed using the same material. However, in the event that the first black matrix 11*c* and the second black matrix 12*c* are physically separated from each other, they may be formed using different materials.

The bus electrodes 11*b* and 12*b* or the barrier ribs 21 may have a dark color to perform a light-shielding function of absorbing external light generated outside the upper substrate 10 and decreasing reflection of the light and a function of improving the purity and contrast of the upper substrate 10, like the black matrix. Alternatively, a specific member, e.g., an upper dielectric layer 13 formed on the upper substrate 10 and a specific member, e.g., the barrier rib 21 formed on the lower substrate 20 are in a complementary-color relation to each other, so that an overlapped portion of the complementary colors is seen close to black when being seen from a front side of the panel, thereby performing the same function as the black matrix.

An upper dielectric layer 13 and a protection layer 14 are laminated over the upper substrate 10 on which the scan electrodes 11 and the sustain electrodes 12 are formed in parallel. Charged particles generated by discharge are accumulated on the upper dielectric layer 13. The upper dielectric layer 13 and the protection layer 14 may function to protect the sustain electrode pair 11 and 12. The protection layer 14 functions to protect the upper dielectric layer 13 from sputtering of charged particles generated at the time of gas discharge and also increase emission efficiency of secondary electrons.

The address electrodes 22 cross the scan electrodes 11 and the sustain electrodes 12. A lower dielectric layer 24 and the barrier ribs 21 are formed over a lower substrate 20 over which the address electrodes 22 are formed.

Phosphor layers 23 are formed on the surfaces of the lower dielectric layer 24 and the barrier ribs 21. Each barrier rib 21 has a longitudinal barrier rib 21*a* and a traverse barrier rib 21*b* formed in a closed type. The barrier rib 21 functions to partition discharge cells physically and prevent ultraviolet rays, which are generated by discharge, and a visible ray from leaking to neighboring discharge cells.

Referring to FIG. 1, a filter 100 may be formed on the front side of the plasma display panel. The filter 100 may include an external light blocking sheet, an anti-reflection (AR) sheet, a near infrared (NIR) shielding sheet, an electromagnetic interference (EMI) shielding sheet, a diffusion sheet, an optical sheet, and the like.

When the gap between the filter 100 and the panel is about 10 μm to about 30 μm, light incident from the outside of the panel can be effectively shielded, and light generated from the panel can be effectively emitted to the outside of the panel. Alternatively, in order to protect the panel against pressure applied from the outside of the panel the gap between the filter 100 and the panel may be about 30 μm to about 120 μm. An adhesive layer having a function of absorbing impact may be formed between the filter 100 and the panel to prevent impact applied from the outside of the panel.

The embodiment may also be applied to not only the structure of the barrier ribs 21 shown in FIG. 1, but also various forms of structures of the barrier ribs 21. For example, the present embodiment may be applied to a differential type barrier rib structure in which the longitudinal barrier rib 21*a* and the traverse barrier rib 21*b* have different heights, a channel type barrier rib structure in which a channel, which can be used as an exhaust passage, is formed in at least one of the longitudinal barrier rib 21*a* and the traverse barrier rib 21*b*, a hollow type barrier rib structure in which a hollow is formed in at least one of the longitudinal barrier rib 21a and the traverse barrier rib 21b, and so on.

In the differential type barrier rib structure, the traverse barrier rib 21b may have a higher height than the longitudinal barrier rib 21a. In the channel type barrier rib structure or the hollow type barrier rib structure, a channel or hollow may be formed in the traverse barrier rib 21b.

In the present embodiment, it has been described that the red (R), green (G), and blue (B) discharge cells are arranged on the same line. However, the discharge cells may be arranged in different forms. For example, the R, G, and B discharge cells may also have a delta type arrangement of a triangle. Alternatively, the discharge cells may be arranged in various forms, such as square, pentagon and hexagon.

Furthermore, the phosphor layer 23 is excited with ultraviolet rays generated during the discharge of a gas, thus generating a visible ray of one of R, G, and B. Discharge spaces between the upper substrate 10 lower substrate 20 and the barrier ribs 21 are injected with an inert mixed gas for discharge, such as He+Xe, Ne+Xe or He+Ne+Xe.

Figure 2:
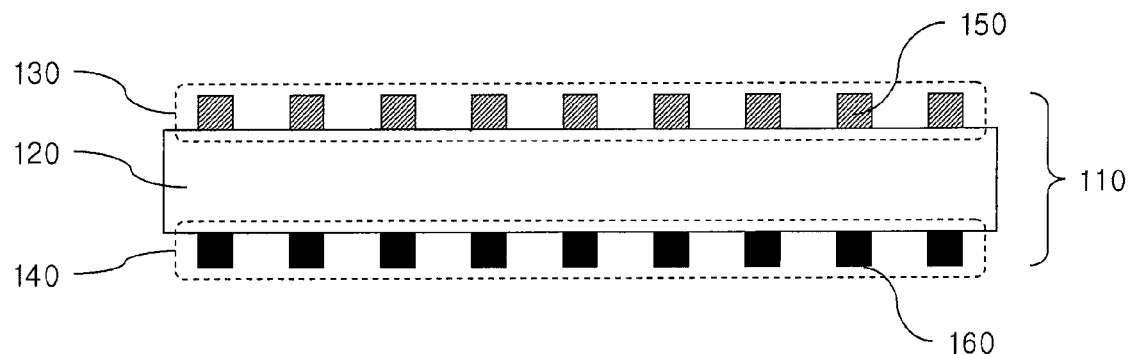
FIG. 2 is a sectional view illustrating an embodiment of the schematic sectional structure of an electromagnetic shielding sheet.

FIG. 2 is a sectional view illustrating an embodiment of the schematic sectional structure of an electromagnetic shielding sheet.

Referring to FIG. 2, the electromagnetic shielding sheet 110 includes a base sheet 120, a first layer 130 formed on a first surface of the base sheet 120, and a second layer 140 formed on a second surface of the base sheet 120.

The base sheet 120 may be made of a transparent plastic material, e.g., a resin-based material formed using an ultraviolet (UV) curing method so that light can sufficiently pass therethrough. In order to protect the front side of the panel, a solid glass material may be used for the base sheet 120.

More specifically, the base sheet 120 may include a polyester-based resin such as polyethylene terephthalate and polyethylene naphthalate, a polyamid-based resin such as nylon 6 or nylon 610, a polyolefin-based resin such as polypropylene or polyethylene. a vinyl-based resin such as polyvinyl chloride, an acrylic-based resin such as polyethyl methacrylate or polymethyl methacrylate, an engineering resin such as polyarylate, polysulfone, polyphenylene ether or polyaramide, a styrene-based resin such as polycarbonate or polystyrene, a cellulose-based resin such as triacetylcellulose (TAC), and the like.

The thickness of the base sheet 120 may be about 50 μm to 200 μm to improve the luminance of a display image by maintaining the transmittance of the base sheet 120 as 80% or more and prevent the damage of the electromagnetic shielding sheet due to external pressure.

Electromagnetic waves radiated from the panel to the front have a bad influence on a user's body, and electromagnetic waves radiated from the panel to the rear have an influence on a panel driving circuit, which may cause malfunction.

Further, external light is reflected from the front of the panel due to a whitish fluorescent material exposed to the lower substrate, so that a black image is recognized as a bright dark color, and therefore, contrast may be lowered.

The first layer 130 may be an electromagnetic shielding layer that functions to shield electromagnetic waves described above, and the second layer 140 may be an external light blocking layer that functions to absorb external light incident from the outside of the panel.

As shown in FIG. 2, the first layer 130 may include a plurality of patterns 150 containing a conductive material. At least some of the plurality of patterns 150 are electrically connected to a ground voltage source and allow electromagnetic waves to be discharged to a ground, so that the electromagnetic waves can be shielded. For example, the patterns 150 formed on the first layer 130 are electrically connected to a back cover of the plasma display apparatus, grounded to the ground voltage source, and allows electromagnetic waves to be discharged to the ground, so that the electromagnetic waves can be shielded.

The plurality of patterns 150 formed on the first layer 130 may include at least one of Cu, Ag, Al, Ni, Pt and carbon nano tube (CNT). Further, the plurality of patterns 150 may be formed in a mesh form.

The second layer 140 may include a plurality of patterns 160 that absorb external light. The patterns 160 formed on the second layer 140 are formed of a material having a darker color than the base sheet 120, e.g. a black material. The plurality of patterns 160 include a light absorbing material, e.g., a carbon-based material or are coated with a black dye to maximize the effect of absorbing external light.

More specifically, the plurality of patterns 160 formed on the second layer 140 may include light absorbing particles, and the light absorbing particles may be resin particles colored with a certain color. The light absorbing particles may be colored with black so as to maximize the light absorption effect.

The size of the light absorbing particle may be more than 1 μm so as to facilitate the preparation of the light absorbing particles and injection into the patterns 160 and to maximize the effect of absorbing external light. In the event that the size of the light absorbing particle is more than 1 μm, the pattern 160 may include more than 10 wt % light absorbing particles. That is, the light absorbing particles having a weight of more than 10% relative to the total weight of the patterns 160 may be included in the patterns 160.

Since an external light source is generally positioned at an upside of the panel, external light may be diagonally incident into the panel from the upside of the panel.

Figure 3:
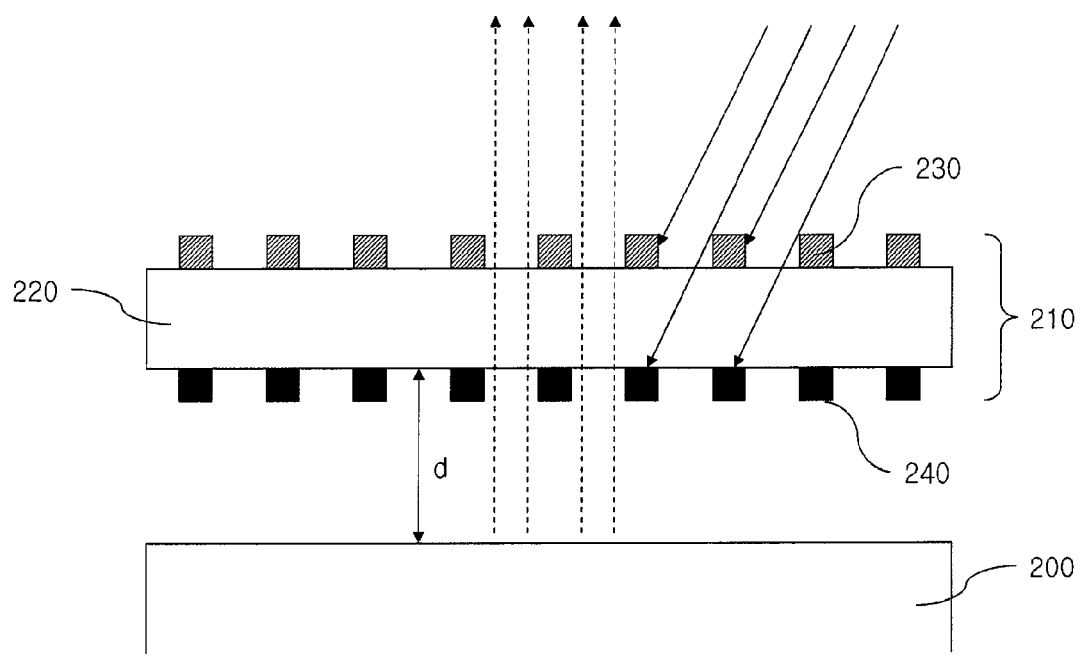
FIG. 3 is a sectional view illustrating the function of an electromagnetic shielding sheet.

Referring to FIG. 3, external light (indicated by solid lines) diagonally incident into the panel is absorbed into a plurality of patterns 240 formed on a second surface of a base sheet 220, and may also be absorbed into a plurality of patterns 230 formed on a first surface of the base sheet 220.

Panel light (indicated by dotted lines) emitted from a panel 200 for display is radiated to the outside of the panel through portions at which the plurality of patterns 230 and 240 are not formed.

In order to enhance external light blocking efficiency of the plurality of patterns 230 formed on the first surface of the base sheet 220, the patterns 230 may be darkened. For example, the pattern 230 may be a metal, a surface of which is darkened.

Accordingly, an electromagnetic shielding sheet 210 can perform the function of shielding electromagnetic waves and blocking external light. Further, the transmittance of the panel (indicated by the dotted lines) is improved, so that an ambient contrast ratio can be enhanced without greatly lowering the luminance of a display image.

The distance d between the electromagnetic shielding sheet 210 and the panel 200 may be about 0.02 mm to about 5 cm so as to improve the transmittance of panel light and prevent the blurring phenomenon of a display image while maximizing the external light blocking effect.

Figure 4:
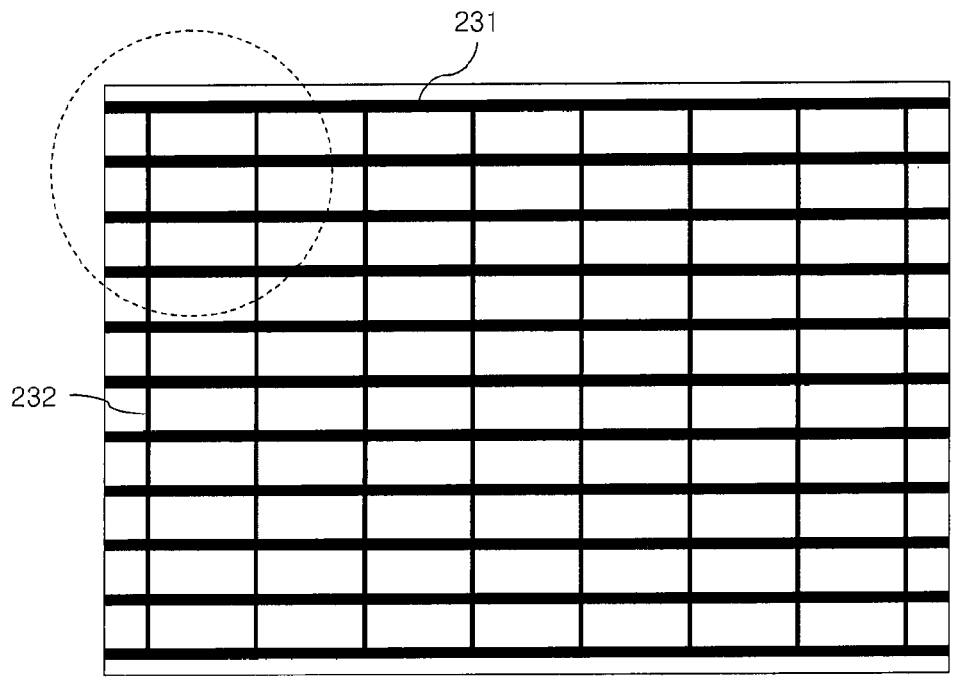
FIGS. 4 and 5 are views illustrating embodiments of the structure of a first layer formed on a base sheet of the electromagnetic shielding sheet.
Figure 5:
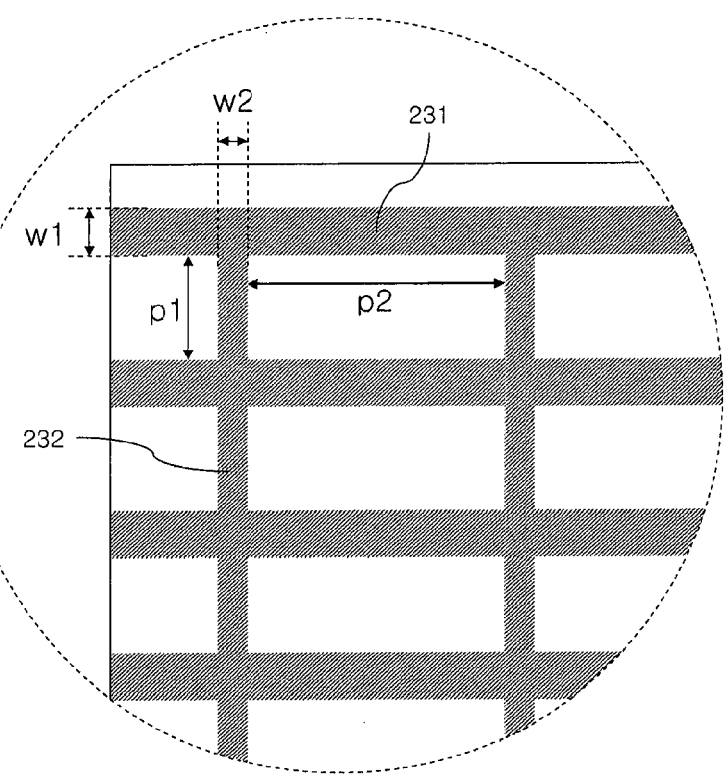

FIGS. 4 and 5 are views illustrating embodiments of the structure of an electromagnetic shielding layer formed on the first surface of the base sheet 220.

Referring to FIG. 4, the electromagnetic shielding layer formed on the first surface of the base sheet 220 may include a plurality of patterns 231 and 232 formed in directions crossing each other.

That is, the electromagnetic shielding layer may include a plurality of horizontal patterns 231 formed in parallel with a long side of the base sheet 220, and a plurality of vertical patterns 232 formed in parallel with a short side of the base sheet 220.

According to an embodiment, the vertical patterns 232 are electrically connected to a ground voltage source and allow electromagnetic waves to be discharged to a ground, so that the electromagnetic waves can be shielded. The horizontal patterns 231 function to absorb external light diagonally incident from the upside of the panel.

FIG. 5 is an enlarged view of a portion indicated by a dotted line in the electromagnetic shielding layer shown in FIG. 4.

Referring to FIG. 5, the width w2 of the vertical pattern 232 for shielding electromagnetic waves may be smaller than the width w1 of the horizontal pattern 231 for blocking external light so as to prevent the luminance of a display image from being lowered due to reduction of the aperture ratio of the electromagnetic shielding sheet and to minimize reduction of the left/right viewing angle of the panel.

The width w1 of the horizontal pattern 231 and the width w2 of the vertical pattern 232 may be about 100 μm or less so as to prevent quality of a display image from being degraded due to the exposure of the patterns 231 and 232 formed in the electromagnetic shielding sheet to a user's eyesight. In order to perform the external light blocking function or the electromagnetic shielding function, the width w1 of the horizontal pattern 231 and the width w2 of the vertical pattern 232 may be about 5 μm or more.

A moire phenomenon may occur due to the overlapping of the plurality of patterns 231 and 232 formed in the electromagnetic shielding sheet and a black matrix, a black layer, bus electrodes, barrier ribs and the like, which are formed with a predetermined pattern in the panel. The moire phenomenon refers to a low-frequency pattern generated while patterns of similar lattice shapes are overlapped with each other. For example, the low-frequency pattern includes a wave pattern seen when mosquito nets overlap each other, and the like.

In order to reduce the moire phenomenon described above, the width w1 of the horizontal pattern 231 may be about 30 μm or less.

In order to prevent degradation of the luminance of a display image and reduction of the left/right viewing angle as described above, the pitch p2 between adjacent vertical patterns 232 may be greater than the pitch p1 between adjacent horizontal patterns 231.

Generally, a light source (not shown) emitting external light that has an influence on degradation of the ambient contrast ratio by being incident onto the panel is positioned at the upside of the panel and incident onto the panel at an incident angle of about 30 to about 60 degrees.

The pitch p1 between adjacent horizontal patterns 231 may be about 30 μm to about 1000 μm so as to effectively absorb external light incident at an incident angle of about 30 to about 60 degrees as described above and to minimize reduction of the luminance of a display image by securing the transmittance of the electromagnetic shielding sheet.

In the event that the pitch p2 between adjacent horizontal patterns 232 is too small, the transmittance of the electromagnetic shielding sheet may be decreased. In the event that the pitch p2 between adjacent horizontal patterns 232 is too large, electromagnetic shielding performance may be lowered. Therefore, the pitch p2 between adjacent horizontal patterns 232 may be in a range of about 30 μm to about 2000 μm.

In order to prevent reduction of the luminance of a display image, the electromagnetic shielding layer including the plurality of patterns 231 and 232 shown in FIGS. 4 and 5 may have an aperture ratio of about 50% to about 95%.

Figure 6:
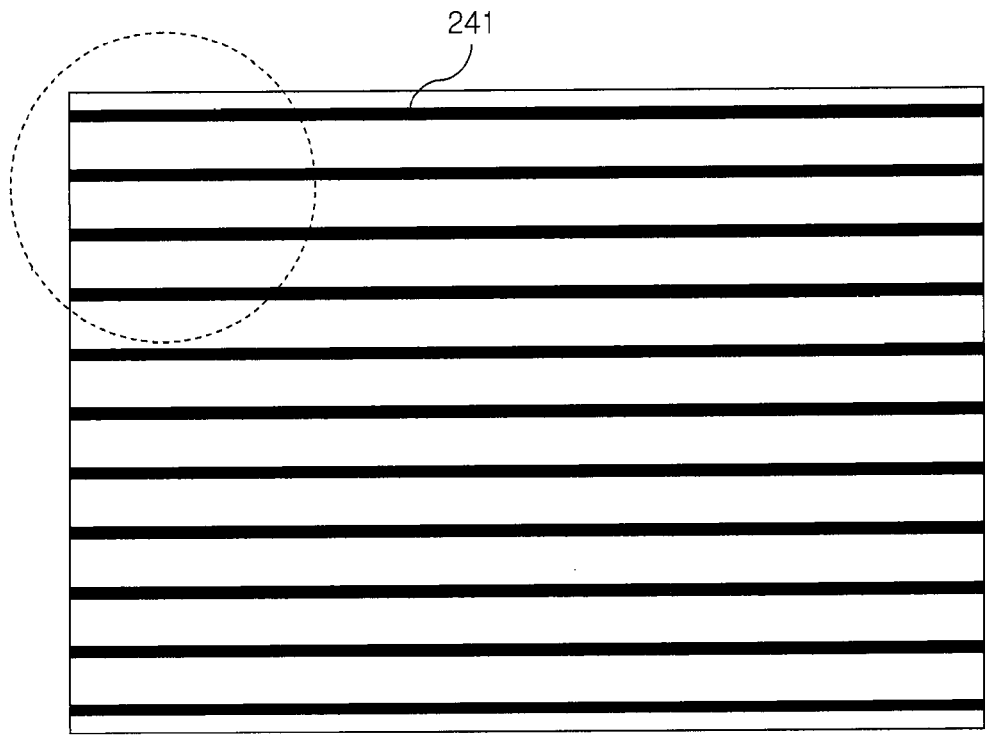
FIGS. 6 and 7 are views illustrating embodiments of the structure of a second layer formed on the base sheet of the electromagnetic shielding sheet.
Figure 7:
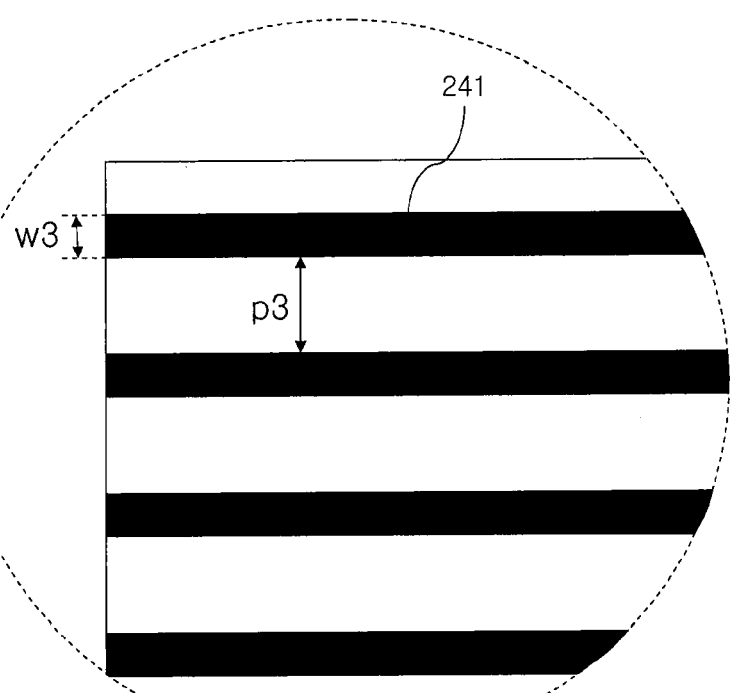

FIGS. 6 and 7 are views illustrating embodiments of the structure of the external light blocking layer formed on the second surface of the base sheet 220.

Referring to FIG. 6, the external light blocking layer formed on the second surface of the base sheet 220 may include a plurality of external light absorbing patterns 241 formed in parallel. The plurality of external light absorbing patterns 241 may be formed in a direction parallel with the long side of the base sheet 220.

As described above, the external light absorbing patterns 241 absorb external light diagonally incident from the upside of the panel.

FIG. 7 is an enlarged view of a portion indicated by a dotted line in the external light blocking layer shown in FIG. 6.

Referring to FIG. 7, the width w3 of the external light absorbing pattern 241 may be about 100 μm or less so as to prevent the external light absorbing patterns 241 formed in the electromagnetic shielding sheet from being exposed to a user's eyesight. However, the width w3 of the external light absorbing pattern 241 may be about 5 μm or more so as to prevent the function of blocking external light from being lowered.

In order to reduce the moire phenomenon described above, the width w3 of the external light absorbing pattern 241 may be about 5 μm to about 30 μm.

The pitch p3 between adjacent external light absorbing patterns 241 may be about 30 μm to about 1000 μm so as to enhance external light absorbing efficiency and to minimize reduction of the luminance of a display image by securing the transmittance of the electromagnetic shielding sheet.

Considering the easiness of fabrication processes of the electromagnetic shielding sheet while minimizing reduction of the luminance of a display image and decrease of the left/right viewing angle of the panel, the width w3 of the external light absorbing pattern 241 may be equal to the width w1 of the horizontal pattern 231 and greater than the width w2 of the vertical pattern 232 of the electromagnetic shielding layer.

The pitch p3 between the external light absorbing patterns 241 may be equal to the pitch p1 between the horizontal patterns 231 and smaller than the pitch p2 between the vertical patterns 232 of the electromagnetic shielding layer.

In order to prevent reduction of the luminance of a display image, the external light blocking layer including the plurality of patterns 241 shown in FIGS. 6 and 7 may have an aperture ratio of about 50% to about 95%.

As described above, since the horizontal patterns 231 included in the electromagnetic shielding layer of the electromagnetic shielding sheet and the external light absorbing patterns 241 included in the external light blocking layer of the electromagnetic shielding sheet may have patterns overlapping each other, a moire phenomenon may occur due to the overlapping of the two patterns 231 and 241.

Figure 8:
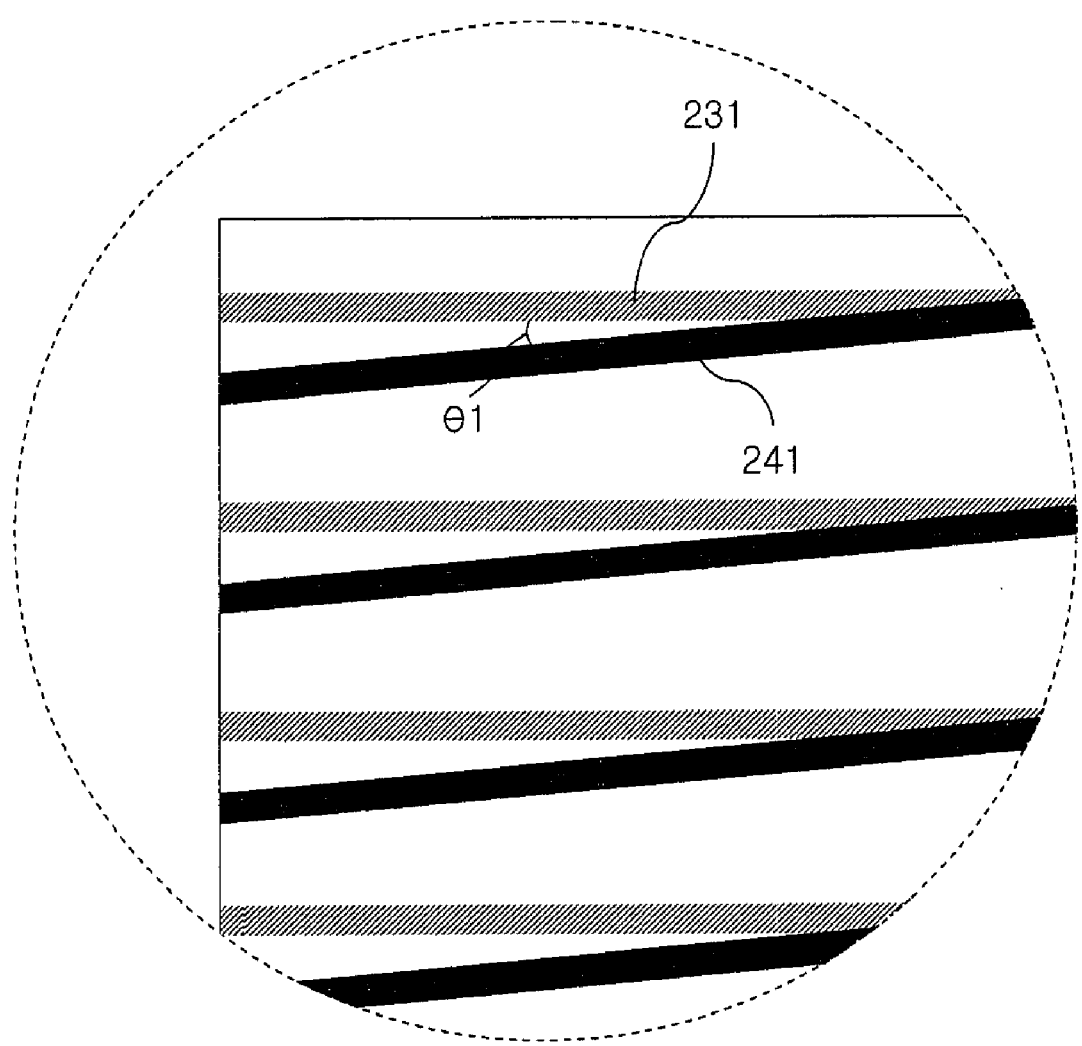
FIG. 8 is a view illustrating an embodiment of the structure of patterns formed in the electromagnetic shielding sheet.

Therefore, as shown in FIG. 8, the external light absorbing patterns included in the external light blocking layer may be diagonally formed with respect to the horizontal patterns 231 included in the electromagnetic shielding layer.

However, in the event that the angle θ1 made between the horizontal pattern 231 and the external light absorbing pattern 241 is too great, the aperture ratio of the electromagnetic shielding sheet decreases, and therefore, the luminance of a display image may be lowered.

In order to prevent the moire phenomenon without greatly lowering the luminance of a display image, the angle θ1 made between the horizontal pattern 231 and the external light absorbing pattern 241 may be 1.1 to 25 degrees.

Figure 9:
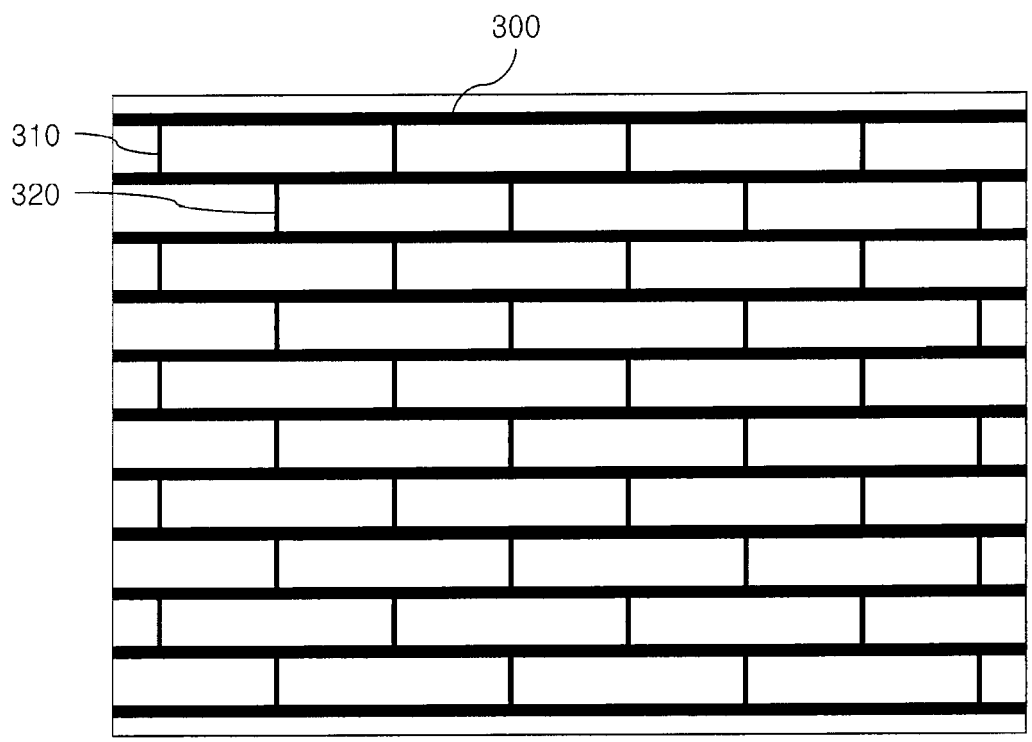
FIGS. 9 and 10 are views illustrating embodiments of the structure of patterns formed on the base sheet of the electromagnetic shielding sheet.
Figure 10:
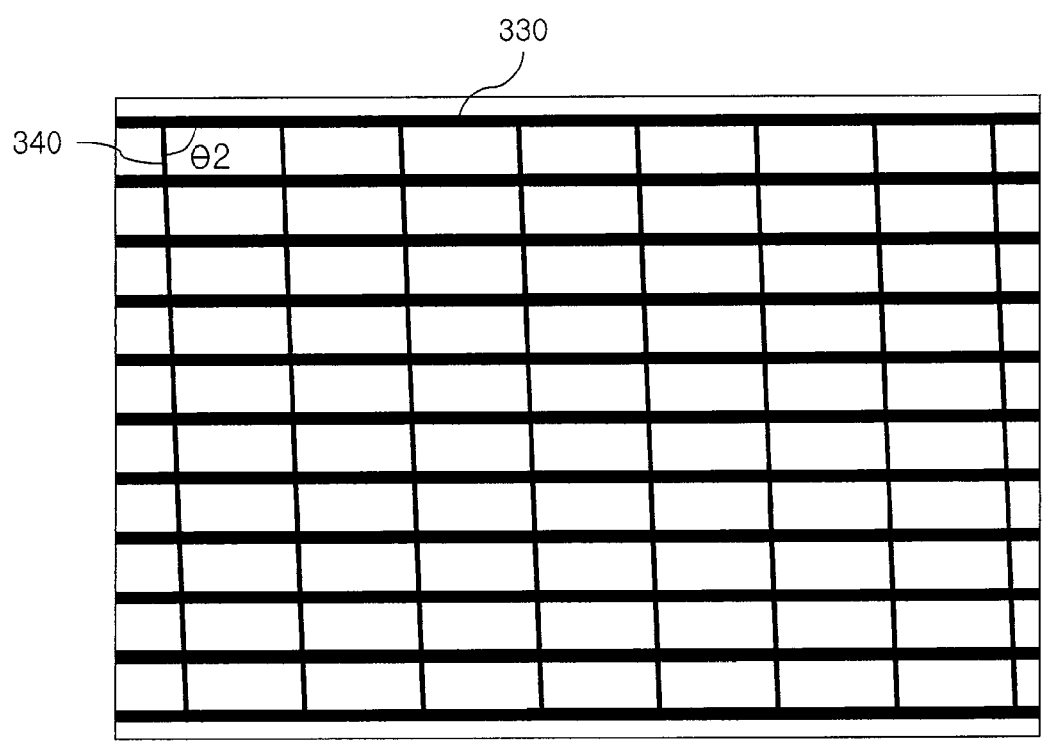

FIGS. 9 and 10 are views illustrating embodiments of the form of a plurality of patterns formed in the electromagnetic shielding sheet.

Referring to FIG. 9, the positions of vertical patterns 310 and 320 formed in the electromagnetic shielding layer may not be formed to correspond to each other but formed to cross each other.

The moire phenomenon that occurs due to the overlapping of certain patterns between the vertical patterns and the electrodes formed in the panel may be reduced through the electromagnetic shielding sheet having the form shown in FIG. 9.

As shown in FIG. 10, horizontal patterns 330 and vertical patterns 340 formed in the electromagnetic shielding layer are not perpendicular to each other, but the vertical patterns 340 may be diagonally formed.

The moire phenomenon that occurs due to the overlapping of certain patterns between the vertical patterns and the electrodes or ribs formed in the panel may be reduced through the electromagnetic shielding sheet having the form shown in FIG. 10.

In order to prevent the moire phenomenon without greatly lowering the luminance of a display image, the angle θ2 made between the horizontal pattern 330 and the vertical pattern 340 may be 65 to 89 degrees.

Although the external light blocking layer of the electromagnetic shielding sheet shown in FIGS. 6 and 7 includes the external light absorbing patterns 241 formed in a direction parallel with the long side of the base sheet, the external light blocking layer of the electromagnetic shielding sheet according to embodiments may include external light absorbing patterns formed in a direction parallel with the short side of the base sheet as shown in FIGS. 4 and 9 or 10.

FIGS. 11 to 17 are sectional views illustrating embodiments of the sectional structure of the electromagnetic shielding sheet.

Figure 11:
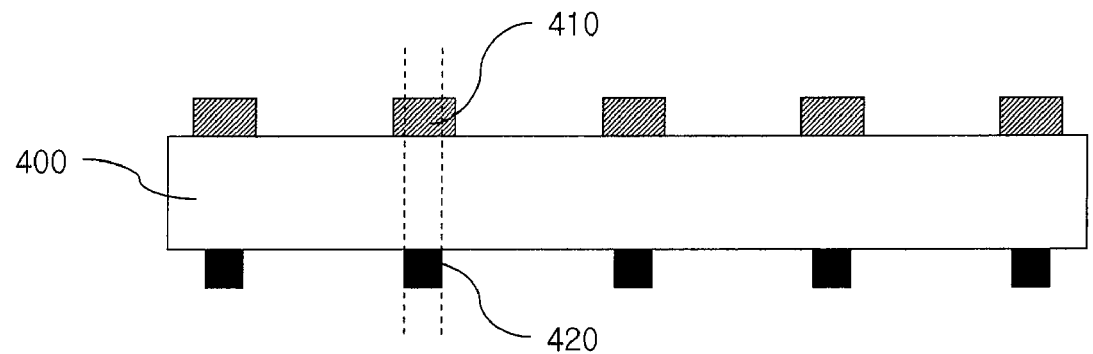
FIGS. 11 to 17 are sectional views illustrating embodiments of the sectional structure of the electromagnetic shielding sheet.
Figure 12:
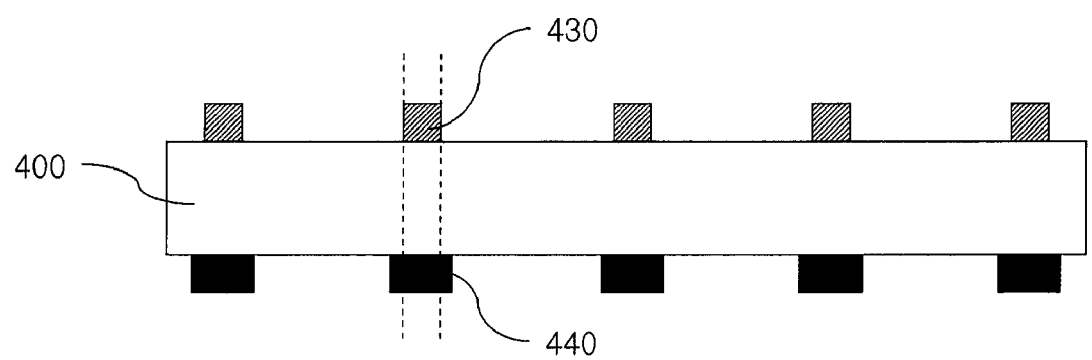

As shown in FIGS. 11 and 12, horizontal patterns 410 formed on a first surface of a base sheet 400 and external light absorbing patterns 420 formed on a second surface of the base sheet 400 may be formed at positions overlapping each other so that the luminance of a display image is improved by enhancing the aperture ratio of the electromagnetic shielding sheet.

Figure 13:
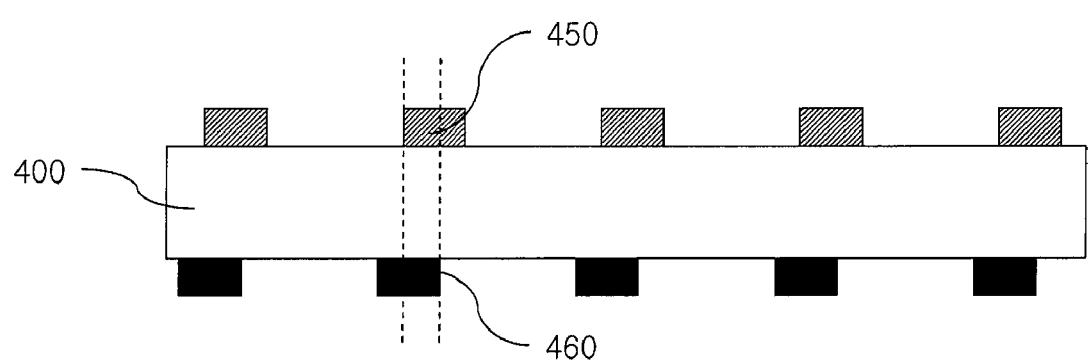

As shown in FIG. 13, the horizontal patterns 410 formed on the first surface of the base sheet 400 and the external light absorbing patterns 420 formed on a second surface of the base sheet 400 may partially overlap each other.

The sectional shape of the external light absorbing pattern formed on the external light blocking layer of the electromagnetic shielding sheet may be various shapes as well as a square shape as described above.

Figure 14:
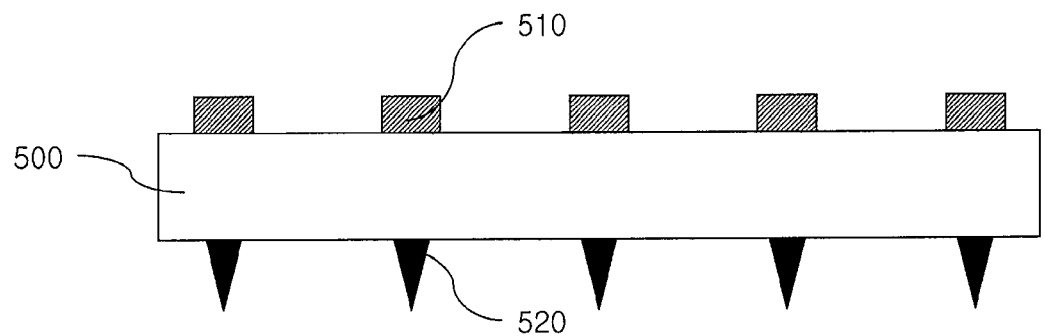

Referring to FIG. 14, an external light absorbing pattern 520 formed on the external light blocking layer of the electromagnetic shielding sheet may have a sectional shape of a triangle, e.g., an isosceles triangle.

Figure 15:
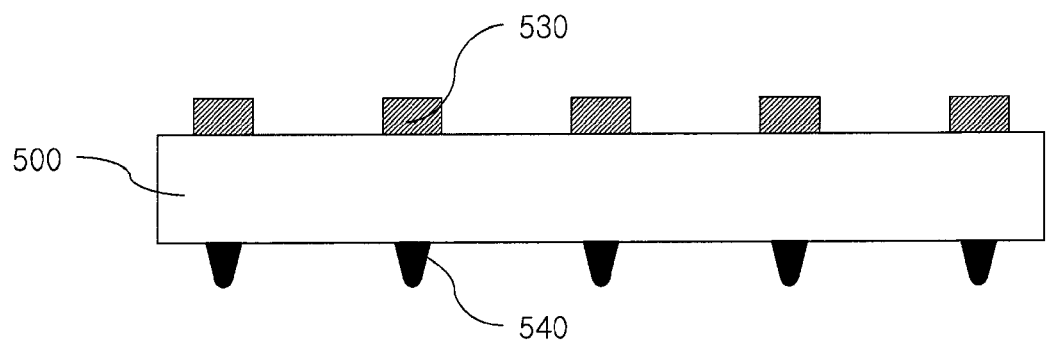

As shown in FIG. 15, an edge portion of the external light absorbing pattern 520 may have a curved sectional shape.

Although the sectional shape of the external light absorbing pattern formed on the external light blocking layer of the electromagnetic shielding sheet has been described above, the sectional shape of a pattern formed on the electromagnetic shielding layer of the electromagnetic shielding sheet may be various shapes as well as a square shape.

Figure 16:
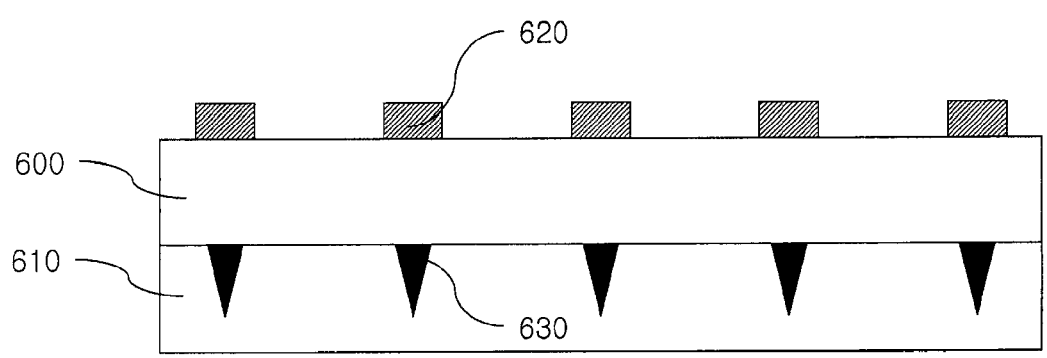
Figure 17:
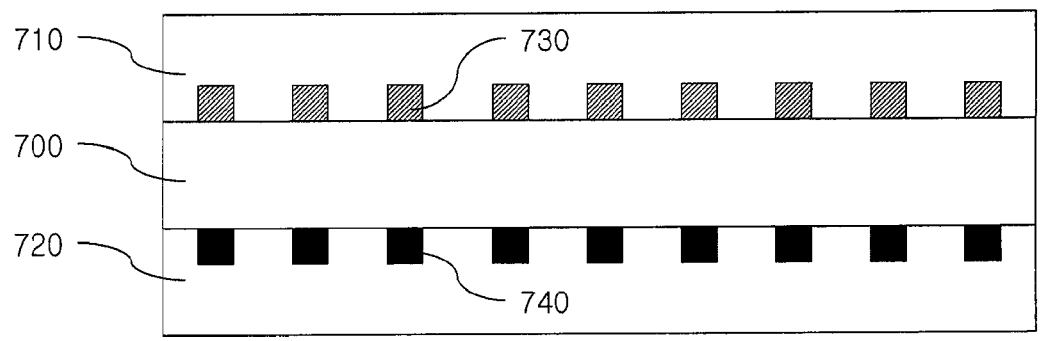

FIGS. 16 and 17 are views illustrating other embodiments of the sectional structure of the electromagnetic shielding sheet. The electromagnetic shielding sheet may include two or more base sheets.

Referring to FIG. 16, a first base sheet 600 is laminated on a second base sheet 610. A first layer including a plurality of patterns 620 may be formed on the first base sheet 600, and a second layer including a plurality of patterns 630 may be formed between the first and second base sheets 600 and 610.

For example, the plurality of patterns 630 formed between the first and second base sheets 600 and 610 may be external light absorbing patterns for absorbing external light, and the sectional shape of the plurality of patterns 630 may be various shapes including a square and the like, as well as the a triangle shown in FIG. 16.

Referring to FIG. 17, an electromagnetic shielding sheet according to an embodiment may have a structure in which a first base sheet 700 is interposed between a second base sheet 710 and a third base sheet 720.

A plurality of patterns 730 for shielding electromagnetic waves are formed between the first and second layers 700 and 710, and a plurality of patterns 740 for absorbing external light are formed between the first and third sheets 700 and 720.

Through the sectional structures shown in FIGS. 16 and 17, it is possible to prevent the electromagnetic shielding sheet from being damaged due to external pressure and to facilitate fabrication processes of the electromagnetic shielding sheet.

For example, in the case of the sectional structure shown in FIG. 16, the plurality of external light absorbing patterns 630 may be formed by forming a plurality of grooves in the second base sheet 610 and then filling a material including a light absorbing material in the plurality of grooves.

Figure 18:
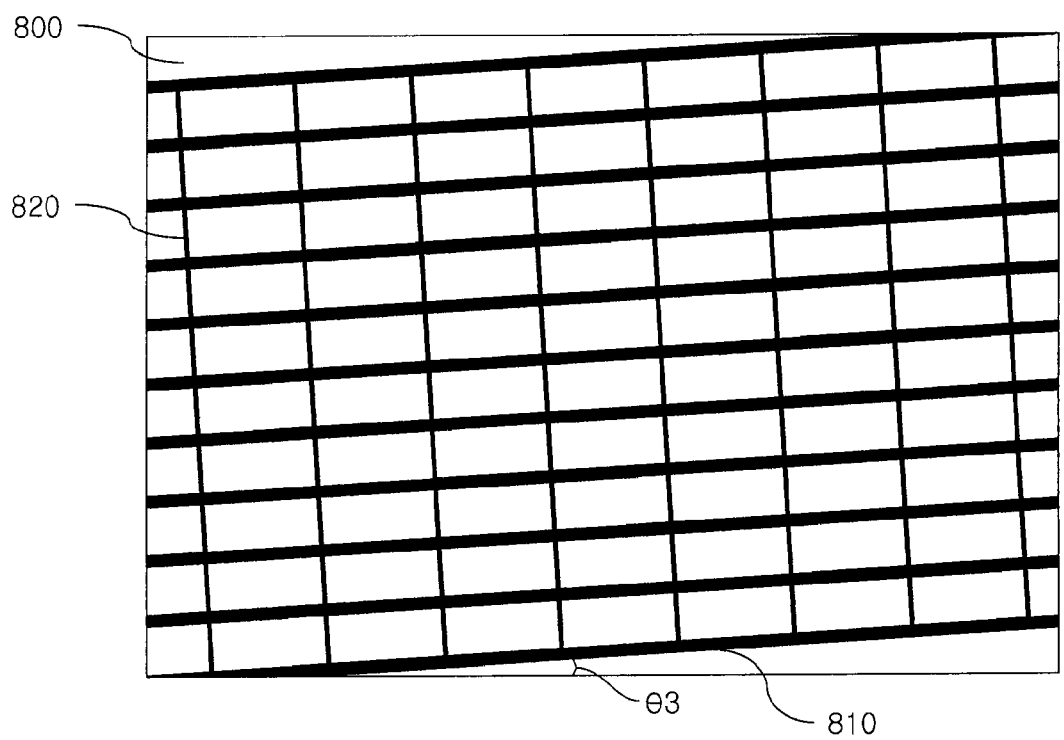
FIG. 18 is a view illustrating an embodiment of the structure of the electromagnetic shielding sheet disposed on a front side of the plasma display panel.

FIG. 18 is a view illustrating an embodiment of the structure of the electromagnetic shielding sheet disposed on the front side of the plasma display panel.

A moire phenomenon may occur due to the overlapping of the plurality of patterns 810 and 820 formed at predetermined pitches in the electromagnetic shielding sheet and a black matrix, a black layer, bus electrodes, barrier ribs and the like, which are formed with a predetermined pattern in a panel 800.

In order to reduce the aforementioned moire phenomenon between the electromagnetic shielding sheet and the panel, the electromagnetic shielding sheet may be diagonally arranged with respect to the panel as shown in FIG. 18.

However, in the event that the angle θ3 made between the horizontal pattern 810 formed in the electromagnetic shielding sheet and a long side of the panel 800 is too large, the left/right viewing angle may be extremely decreased, and the ambient contrast ratio of a display image may be lowered.

Therefore, the angle θ3 made between the horizontal pattern 810 and the long side of the panel 800 may be about 0 to about 50 degrees so as to sufficiently secure the left/right viewing angle of the panel, to improve the ambient contrast ratio of a display image, and to reduce the moire phenomenon.

FIGS. 19 to 23 are sectional views illustrating embodiments of a method of forming the electromagnetic shielding sheet.

Figure 19:
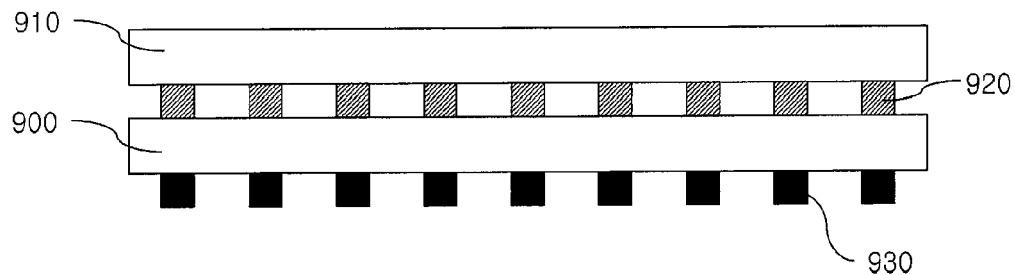
FIGS. 19 to 23 are sectional views illustrating embodiments of a method of forming the electromagnetic shielding sheet.

Referring to FIG. 19, a plurality of electromagnetic shielding patterns 920 for shielding electromagnetic waves are formed on a first base sheet 910, and a plurality of external light blocking patterns 930 for blocking external light are formed on a second base sheet 900.

As described above, the first and second base sheets 910 and 900 may be made of a transparent plastic material through which light can sufficiently pass, e.g., a resin-based material formed using a UV curing method. In order to protect the front side of the panel, a solid glass material may be used for the first and second base sheets 910 and 900.

In the electromagnetic shielding sheet shown in FIG. 19, the positions of the electromagnetic shielding patterns 920 and the external light blocking patterns 930 may be changed with each other. For example, the external light blocking patterns 930 may be positioned between the first and second base sheets 910 and 900.

Figure 20:
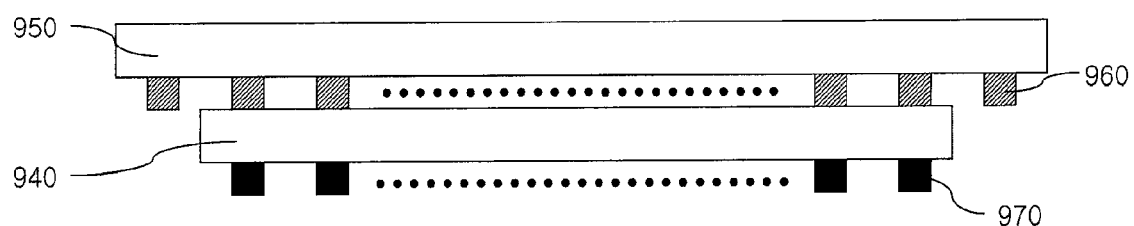

Referring to FIG. 20, a first base sheet 950 having electromagnetic shielding patterns 960 may have a broader area than a second base sheet 940 having external light blocking patterns 970 to ground electromagnetic shielding patterns positioned at edges of the panel in the electromagnetic shielding patterns 960.

Figure 21:
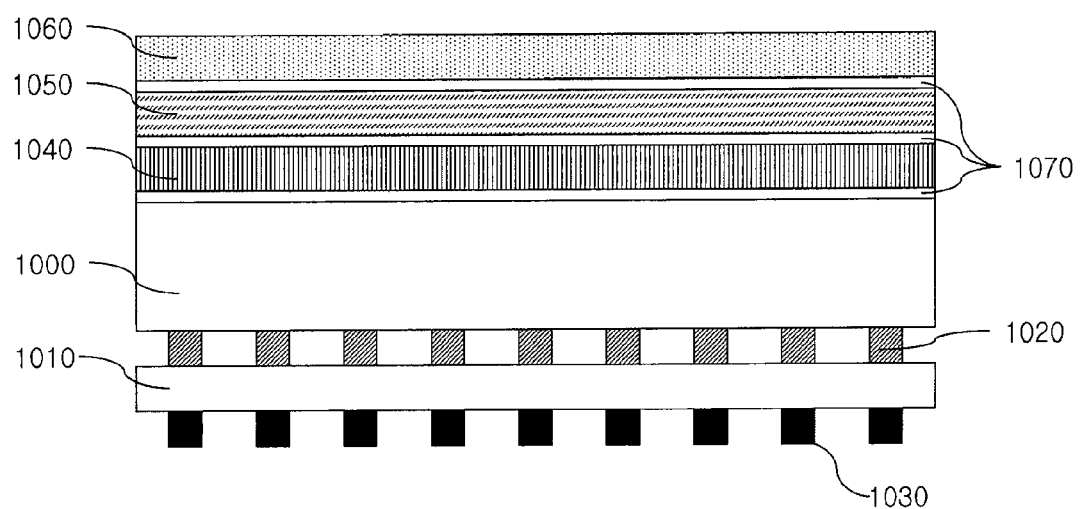

Referring to FIG. 21, a filter for display may have a structure in which a plurality of functional layers 1040, 1050 and 1060 are sequentially laminated on a first base 1000. The plurality of functional layers 1040, 1050 and 1060 may be an anti-reflection (AR) layer, a near infrared (NIR) shielding layer, an optical layer, respectively.

The AR layer prevents light incident from the outside of the panel from being reflected to reduce a dazzling phenomenon, and the NIR shielding layer shields near-infrared light radiated from the panel so that signals transmitted through infrared light used for a remote controller or the like can be normally transmitted.

The optical layer includes a predetermined dye or pigment, and functions to improve the color temperature and luminance of light radiated from the panel.

Adhesive layers 1070 are formed between the functional layers 1040 and 1050, between the functional layers 1050 and 1060, and between the first base sheet 1000 and the functional layer 1040 to allow the respective functional layers to be strongly adhered to one another. Alternatively, base sheets (not shown) made of a transparent material may be formed between the respective functional layers.

The laminating order of the plurality of functional layers 1040, 1050, and 1060 may be varied by those skilled in the art. Alternatively, at least any one of the respective functional sheets may be omitted.

In order to protect the front side of the panel, a solid glass material may be used for the first base sheet 1000.

As shown in FIG. 21, electromagnetic shielding patterns 1020 may be directly formed on the other surface of the first base sheet 1000 having the plurality of functional layers 1040, 1050 and 1060 formed on one surface of the first base sheet 1000. For example, the electromagnetic shielding patterns 1020 may be directly formed on the first base sheet 1000 made of a glass material using an off-set method, a printing method, a plating method or the like.

Meanwhile, external light blocking patterns 1030 may be formed on a second base sheet 1010, and the second base sheet 1010 may be made of a transparent plastic material, e.g., a resin-based material formed using an ultraviolet (UV) curing method so that light can sufficiently pass therethrough.

In the structure of the filter shown in FIG. 21, the positions of the electromagnetic shielding patterns 1020 and the external light blocking patterns 1030 may be changed with each other. For example, the external light blocking patterns 1030 may be directly formed on the first base sheet 1000.

Figure 22:
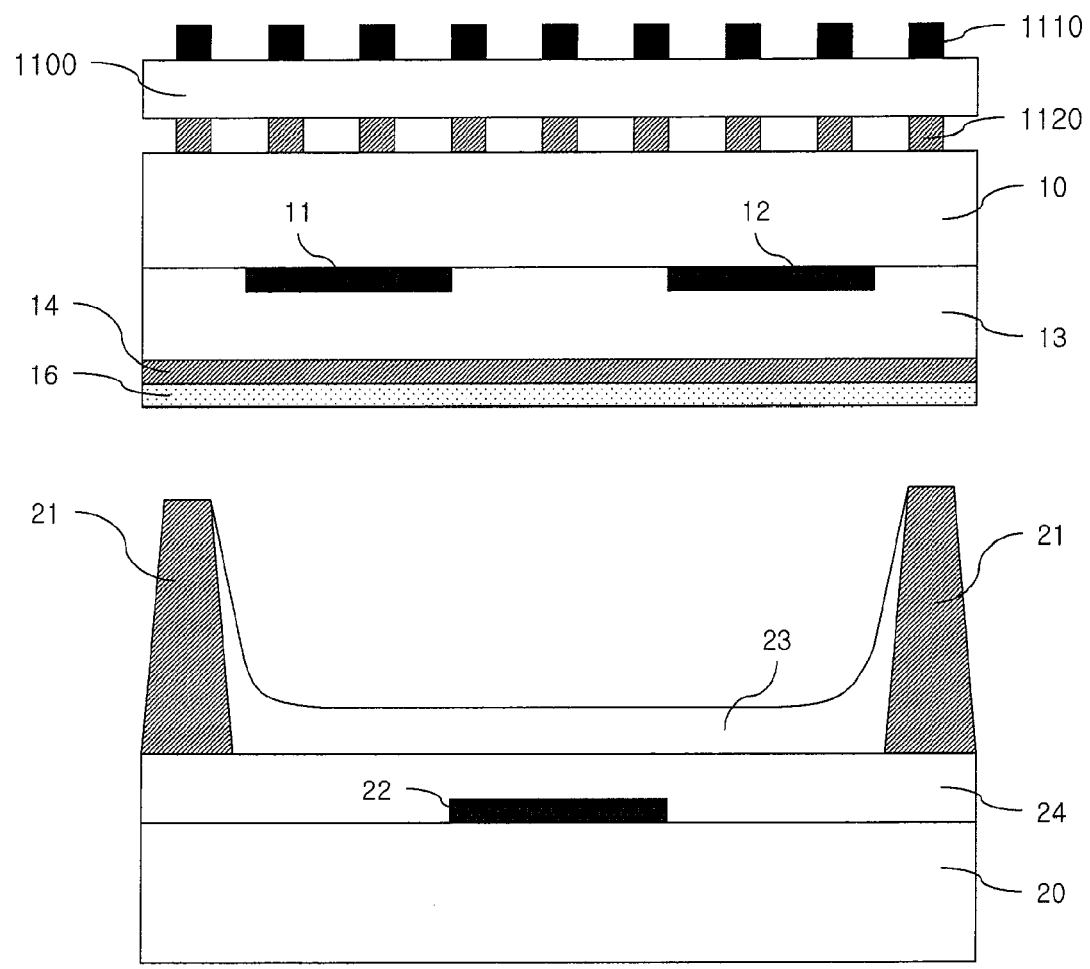

FIG. 22 is a sectional view illustrating another embodiment of the structure of a plasma display apparatus having an electromagnetic shielding sheet formed on the front side of a plasma display panel. Description of the plasma display panel having the same structure of the plasma display panel described with reference to FIG. 1 will be omitted herein.

Referring to FIG. 22, electromagnetic shielding patterns 1120 may be directly formed on an upper substrate 10 having scan and sustain electrodes 11 and 12. For example, the electromagnetic shielding pattern 1020 may be directly formed on the upper substrate 10 made of a glass material using an off-set method, a printing method, a plating method or the like.

A base sheet 1100 is formed on the electromagnetic shielding patterns 1020, and external light blocking patterns 1110 are formed on the base sheet 1100. The base sheet 1100 may be made of a transparent plastic material, e.g., a resin-based material formed using an ultraviolet (UV) curing method so that light can sufficiently pass therethrough.

Figure 23:
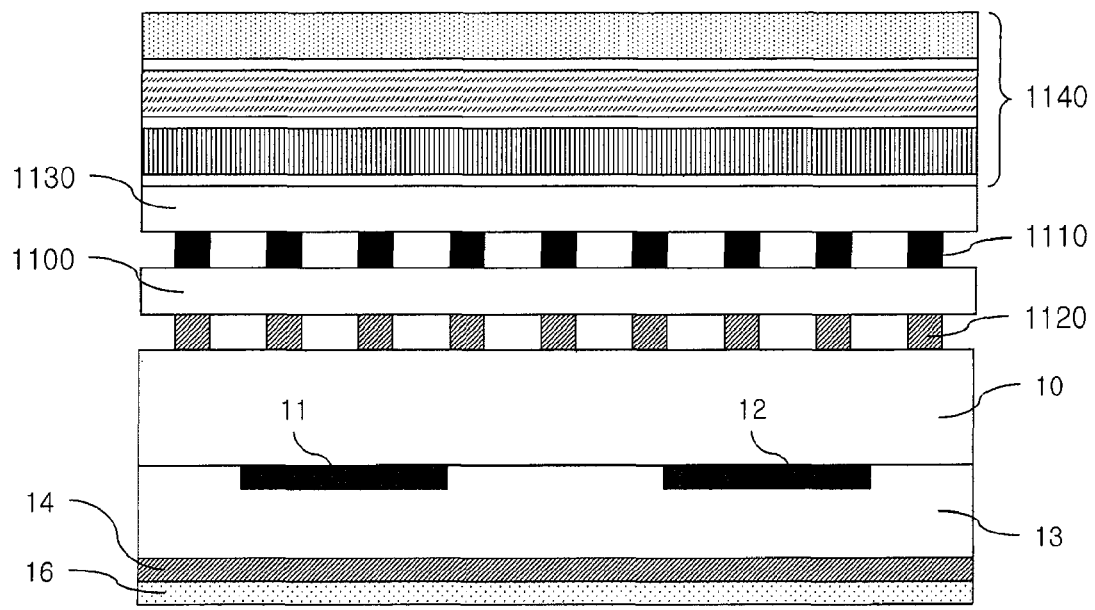

Referring to FIG. 23, a base sheet 1130 of the filter is formed on the external light blocking patterns 1110, and a plurality of functional layers 1140 are laminated on the base sheet 1130 of the filter as described with reference to FIG. 21.

The base sheet 1130 of the filter may be made of a transparent plastic material, e.g., a resin-based material formed using an ultraviolet (UV) curing method so that light can sufficiently pass therethrough. In order to protect the front side of the panel, a solid glass material may be used for the base sheet 1130 of the filter.

The electromagnetic shielding sheet may be used for various display panels such as a liquid crystal display (LCD), an organic light emitting diode (OLED), a field effect display (FED), a surface-conduction electron-emitter display (SED) and the like.

In an electromagnetic shielding sheet and a plasma display apparatus, configured as described above, conductive patterns for shielding electromagnetic waves and blocking external light are formed on a first surface of a base sheet, and patterns for blocking external light are formed on a second surface of the base sheet, so that the functions of shielding electromagnetic waves and blocking external light can be simultaneously performed using one sheet, and therefore, the ambient contrast ratio of a display image can be enhanced without greatly increasing manufacturing costs. Further, patterns for shielding electromagnetic waves are directly formed a glass member of a filter or an upper substrate of the panel, so that processes of forming an electromagnetic shielding sheet can be easily performed.

While implementations have been described, it is to be understood that the disclosure is not limited to the implementations described, but, on the contrary, is intended to cover various modifications and equivalent arrangements included within the spirit and scope of the appended claims.

What is claimed is:

1. A filter comprising:
   a plurality of sheets including an electromagnetic shielding sheet, wherein the electromagnetic shielding sheet comprises:
   a first base sheet; and
   a second base sheet,
   wherein the first base sheet includes first and second patterns formed in directions crossing each other on a surface of the first base sheet,
   wherein the second base sheet includes a third pattern formed on a surface of the second base sheet,
   wherein the first and second patterns include a conductive material, the third pattern includes a light absorbing material, and at least one of the first and second patterns is grounded,
   wherein the surface of the first base sheet has a larger area than the surface of the second base sheet,
   wherein the first pattern and the third pattern are parallel to each other, and wherein the third pattern is positioned to overlap the first pattern.

2. The filter of claim 1, wherein the first and second patterns are made of a darkened metal.

3. The plasma display apparatus of claim 1, wherein:
the surface of the first base sheet is rectangular in shape with two sides longer than the other two sides, and
an angle between the first pattern and a longer side of the surface of the first base sheet is from about zero to about 50 degrees.

4. The filter of claim 1, wherein a width of at least one of the first and second patterns is different from a width of the third pattern.

5. The filter of claim 4, wherein:
the surface of the first base sheet is rectangular in shape with two sides shorter than the other two sides, and
the width of the second pattern is formed in a direction parallel with a short side of the first base sheet and is smaller than the width of the third pattern.

6. The filter of claim 1, wherein:
the surface of the first base sheet is rectangular in shape with two sides shorter than the other two sides, and
the width of the second pattern is formed in a direction parallel with a short side of the first base sheet is smaller than the width of the first pattern.

7. The filter of claim 6, wherein the width of at least one of the first and third patterns is from about 5 μm to about 100 μm.

8. The filter of claim 1, wherein:
the surface of the first base sheet is rectangular in shape with two sides shorter than the other two sides, and
the second pattern is formed in a direction parallel with a short side of the second base sheet and is grounded.

9. The filter of claim 1, wherein:
the surface of the first base sheet is rectangular in shape with two sides shorter than the other two sides,
the first pattern includes a plurality of first patterns formed in a direction parallel with a long side of the first base sheet and a plurality of second patterns formed in a direction parallel with a short side of the first base sheet, and
a pitch between adjacent first patterns is smaller than a pitch between adjacent second patterns.

10. The filter of claim 1, wherein the second base sheet includes a fourth pattern having a width smaller than a width of the third pattern.

11. The filter of claim 1, wherein the aperture ratio of each of the first and second base sheets is from about 50% to about 95%.

12. The filter of claim 1, wherein the first and second patterns are formed between the first and second base sheets.

13. The filter of claim 12, wherein the first and second patterns are formed to be in contact with the second base sheet.

14. The filter of claim 1, wherein the first base sheet is made of glass.

15. A plasma display apparatus comprising:
a plasma display panel including an upper substrate and a lower substrate attached to each other, the upper substrate having a plurality of first and second electrodes formed thereon, the lower substrate having a plurality of third electrodes formed thereon; and an electromagnetic shielding sheet disposed on a front side of the panel,
wherein the electromagnetic shielding sheet includes a first base sheet and a second base sheet,
wherein the first base sheet includes first and second patterns formed in directions crossing each other on a surface of the first base sheet,
wherein the second base sheet includes a third pattern formed on a surface of the second base sheet,
wherein the first and second patterns include a conductive material, the third pattern includes a light absorbing material, and at least one of the first and second patterns is grounded,
wherein the surface of the first base sheet has a larger area than the surface of the second base sheet,
wherein the first pattern and the third pattern are parallel to each other, and
wherein the third pattern is positioned to overlap the first pattern.

16. The plasma display apparatus of claim 15, wherein the first and second patterns are formed between the upper substrate of the panel and the second base sheet.

17. The plasma display apparatus of claim 15, wherein the first and second patterns are formed to be in contact with the upper substrate of the panel.

18. The plasma display apparatus of claim 15, wherein an angle made between the third pattern and the first electrode is from about zero to about 50 degrees.

19. The plasma display apparatus of claim 15, wherein a gap between the electromagnetic shielding sheet and the upper substrate of the panel is from about 0.02 mm to about 0.5 cm.

* * * * *